(12) United States Patent
Ramaraju

(10) Patent No.: US 8,493,121 B1
(45) Date of Patent: Jul. 23, 2013

(54) RECONFIGURABLE FLIP-FLOP

(75) Inventor: Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/605,385

(22) Filed: Sep. 6, 2012

(51) Int. Cl.
*H03K 3/356* (2006.01)

(52) U.S. Cl.
USPC .......................................................... 327/203

(58) Field of Classification Search
USPC .......................... 327/199–203, 208–215, 218
See application file for complete search history.

(56) References Cited

U.S. PATENT DOCUMENTS

| | | | |
|---|---|---|---|
| 6,938,225 | B2 | 8/2005 | Kundu |
| 7,082,560 | B2 | 7/2006 | Parulkar et al. |
| 7,278,074 | B2 * | 10/2007 | Mitra et al. .................... 714/724 |
| 7,596,732 | B2 * | 9/2009 | Branch et al. ................. 714/726 |
| 2010/0052756 | A1 | 3/2010 | Tang |
| 2012/0032720 | A1 | 2/2012 | Sofer |

OTHER PUBLICATIONS

Afghani et al., "Double Edge-Triggered D-Flip-Flops for High-Speed CMOS Circuits", IEEE Journal of Solid-State Circuits, Aug. 1991, pp. 1168-1170, vol. 26, No. 8.
Hossain et al., "Low Power Design Using Double Edge Triggered Flip-Flops", IEEE Transactions on Very Large Scale Integration Systems, Jun. 1994, pp. 261-265, vol. 2, No. 2.
Johnson et al., "A Single Latch, High-Speed Double-Edge Triggered Flip-Flop (DETFF)", Department of Electrical Engineering, Purdue University and University of Pittsburgh, 2001, pp. 189-192.
Mishra et al., "High Performance Double Edge-Triggered Flip-Flop Using a Merged Feedback Technique", IEE Proc. Circuits Devices Syst., Dec. 2000, pp. 363-368, vol. 147, No. 6.
Nedovic et al., "Dual-Edge Triggered Storage Elements and Clocking Strategy for Low-Power Systems", IEEE Transactions on Very Large Scale Integration Systems, May 2005, pp. 577-590, vol. 13, No. 5.
Pedram et al., "A New Design of Double Edge Triggered Flip-Flops", Department of Electrical Engineering, University of Southern California and Hangzhou University, 1998, pp. 417-420.
Phyu et al., "Power-Efficient Explicit-Pulsed Dual-Edge Triggered Sense-Amplifier Flip-Flops", IEEE Transactions on Very Large Scale Integration Systems, Jan. 2011, pp. 1-9, vol. 19, No. 1.
Ramaraju, Ravindraraj, "Double Edge Triggered Flip Flop", Freescale Semiconductor, Inc., U.S. Appl. No. 13/150,322, filed Jun. 1, 2011.

* cited by examiner

*Primary Examiner* — Lincoln Donavan
*Assistant Examiner* — Sibin Chen

(57) ABSTRACT

A device (300, 1000) provides a dual-edge triggered flip-flop (DETFF) that is reconfigurable to a master-slave flip-flop (MSFF). The device includes a reconfigurable MUX-D flip-flop including two distinct circuit configurations. In a first configuration, two latches or storage elements (340, 360, 1040, 1060) are operating in series to provide a MUX-D flip-flop. In a second configuration, the storage elements (340, 360, 1040, 1060) are operating in parallel to provide a dual-edge triggered flip-flop (DETFF).

23 Claims, 15 Drawing Sheets

NORMAL MODE CLOCK HIGH OPERATION

NORMAL MODE CLOCK LOW OPERATION

TEST MODE CLOCK HIGH OPERATION

TEST MODE CLOCK LOW OPERATION

TEST MODE CLOCK LOW OPERATION

TEST MODE CLOCK HIGH OPERATION WITH EXTRA LATCH

TEST MODE CLOCK LOW OPERATION WITH EXTRA LATCH

RECONFIGURABLE DET-MSFF WITH HOLD LATCH

TEST MODE CLOCK HIGH OPERATION WITH HOLD LATCH

TEST MODE CLOCK LOW OPERATION WITH HOLD LATCH

TEST MODE WAVE FORM

RECONFIGURABLE FLIP-FLOP

BACKGROUND

1. Field

This invention relates generally to integrated circuits and more particularly to reconfigurable flip-flops.

2. Related Art

Typically, flip-flops in IC circuits are single-edge triggered. Such flip-flops latch a state on either a positive edge transition of a clock (logical LOW, e.g., "0" to logical HIGH, e.g., "1" transition), or on a negative edge transition of the clock ("1" to "0" transition). A faster data rate and some power savings can be achieved if the state element is designed such that it latches the state on the positive as well as the negative edge of the clock. The type of flip-flop that latches on both the positive edge and negative edge of the clock is known as a dual-edge triggered flip-flop. FIG. 1 is a circuit diagram of a known single-edge triggered (SET) design 100. Shown in a series configuration starting from the left, an input passes through a control gate 102 being controlled by a complementary clock CK_B or $\overline{CK}$ 132. The output of the control gate 102 is fed to a master portion of the flip-flip or latch 104 and the output of the master latch 104 is fed to control gate 106 controlled by clock CK 136. The output of the control gate 106 is fed to a slave latch 108. The corresponding single-edge clock signals shown in FIG. 2 for single-edge trigger are 200 and 250. Note that both the SET design 100 and DET design 150 are edge sensitive devices. The data storage in these edge-sensitive flip-flops occurs at specific edges of clock signals. In the SET design 100 data is "launched" or moves forward at each rising clock edge 212 and 216.

Also shown in FIG. 1 is a known double-edge triggered (DET) design 150 including complementary clocks CKD 182 and CKD_B 188. The corresponding clock signals 250, shown in FIG. 2 for dual-edge trigger, are 262 and 268. The DET design 150 the input is fed to a de-multiplexer 152 to select between one of two parallel path master-slave 154 or slave master 156 before going into multiplexer 158.

During each clock period in the DET design 150, single-edge triggered flip-flops are triggered by, and store data at, only one edge—the rising edge 262 or the falling edge 268—of the clock signal. In the DET design 150 there are two data paths master-slave (M/S) 144 and slave-master (S/M) 142. The data flows through one of these two data paths 144, 142 depending on whether is it a rising or falling clock edge 262 or 268. More specifically, for the rising clock edge 262 data flows through M/S 154 and through S/M 156 for the falling clock edge 268.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The term "coupled," as used herein, is defined as "connected," and encompasses the coupling of devices that may be physically, electrically or communicatively connected (according to context), although the coupling may not necessarily be directly, and not necessarily be mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function. The term "transmission gate" is any switch or electrical component capable of interrupting current flow in a circuit.

Electronic devices use variety of integrated circuits (ICs). In addition to physical circuit size and speed trade-offs, IC designers give power consumption strong considerations. For example, handheld electronic devices include ICs to implement user interfaces for receiving user instructions and handling the electronic processing of those instructions. These handheld electronic devices require low power designs. Clock distribution networks in handheld devices can account for significant power consumption. Further, as the complexity of the implementation increases, the system of digital ICs becomes more sophisticated. In turn, as digital devices become more sophisticated, the task of designing, testing, and debugging the digital systems implementing the devices becomes more difficult. Thus, validation of a system design and verification of the proper functionality of the system has become an important factor in the development of computer technology.

Mechanisms to observe the sequential logic state of an integrated circuit (IC) on a tester, or in a system, are critical to debugging operations. The observation is typically achieved when the IC is exercising its intended functionality on the tester or the system. To observe the logical state of any digital IC, the state elements need to have scan capability. Scan capability refers to the inclusion of an alternative path used to control and/or observe the state of a state element.

A device is described to provide a reconfigurable dual-edge triggered flip-flop (DETFF) to a master-slave flip-flop (MSFF). More specifically, the device is a reconfigurable MUX-D flip-flop including two distinct circuit configurations. In a first configuration, two latches or two storage elements of the circuit are operating in series to provide a MSFF. In the second configuration, the storage elements are operating in parallel to provide a DETFF.

EXAMPLE 1

Reconfigurable DETFF to a MSFF

Figures 1, 2:
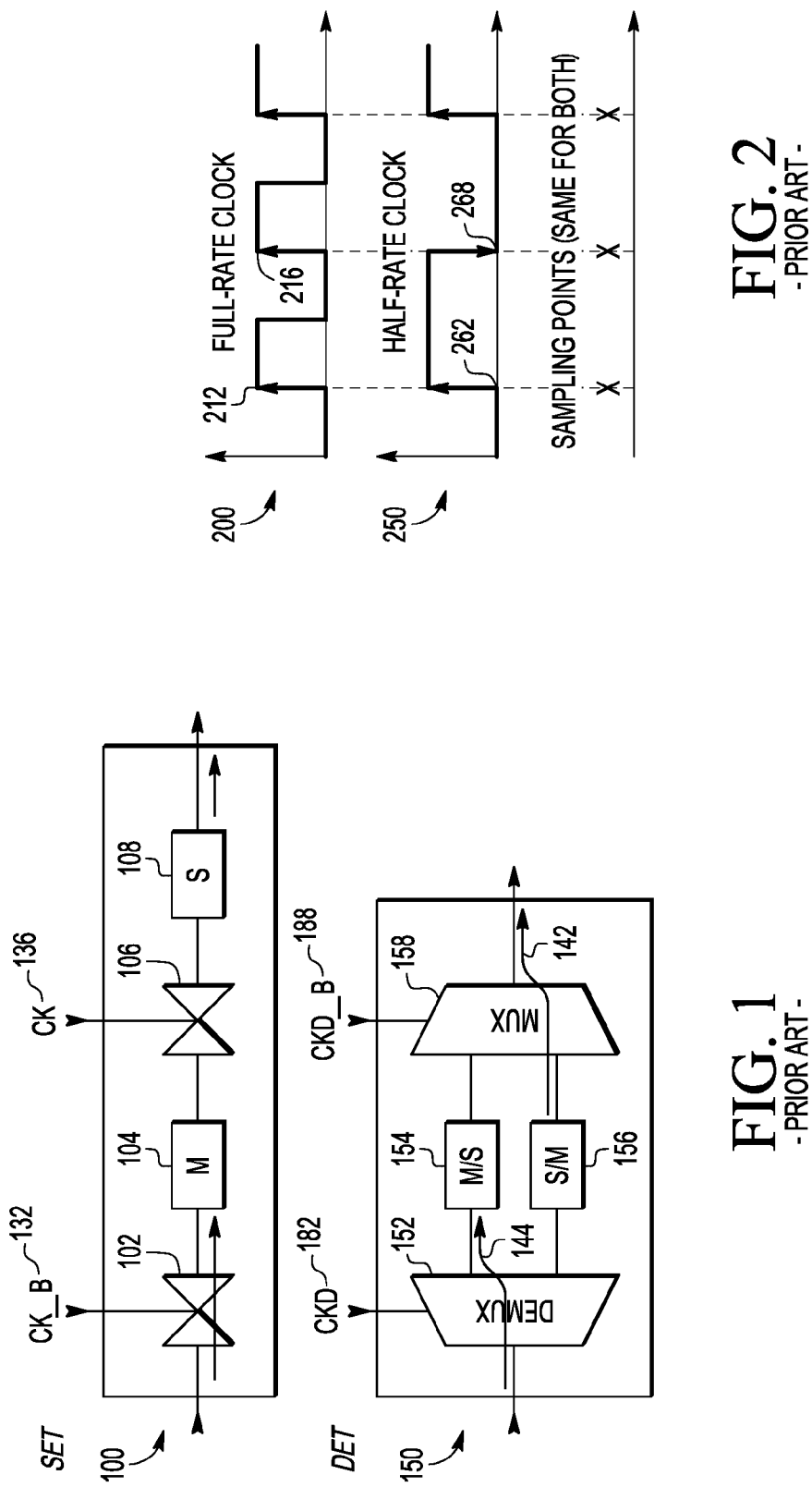
FIG. 1 is a circuit diagram of a known single-edge triggered (SET) design and a dual-edge triggered (DET) design along.
FIG. 2 is a timing diagram of a half-rate clock and a full-rate clock corresponding to the known SET design and DET designs of FIG. 1.
Figure 3:
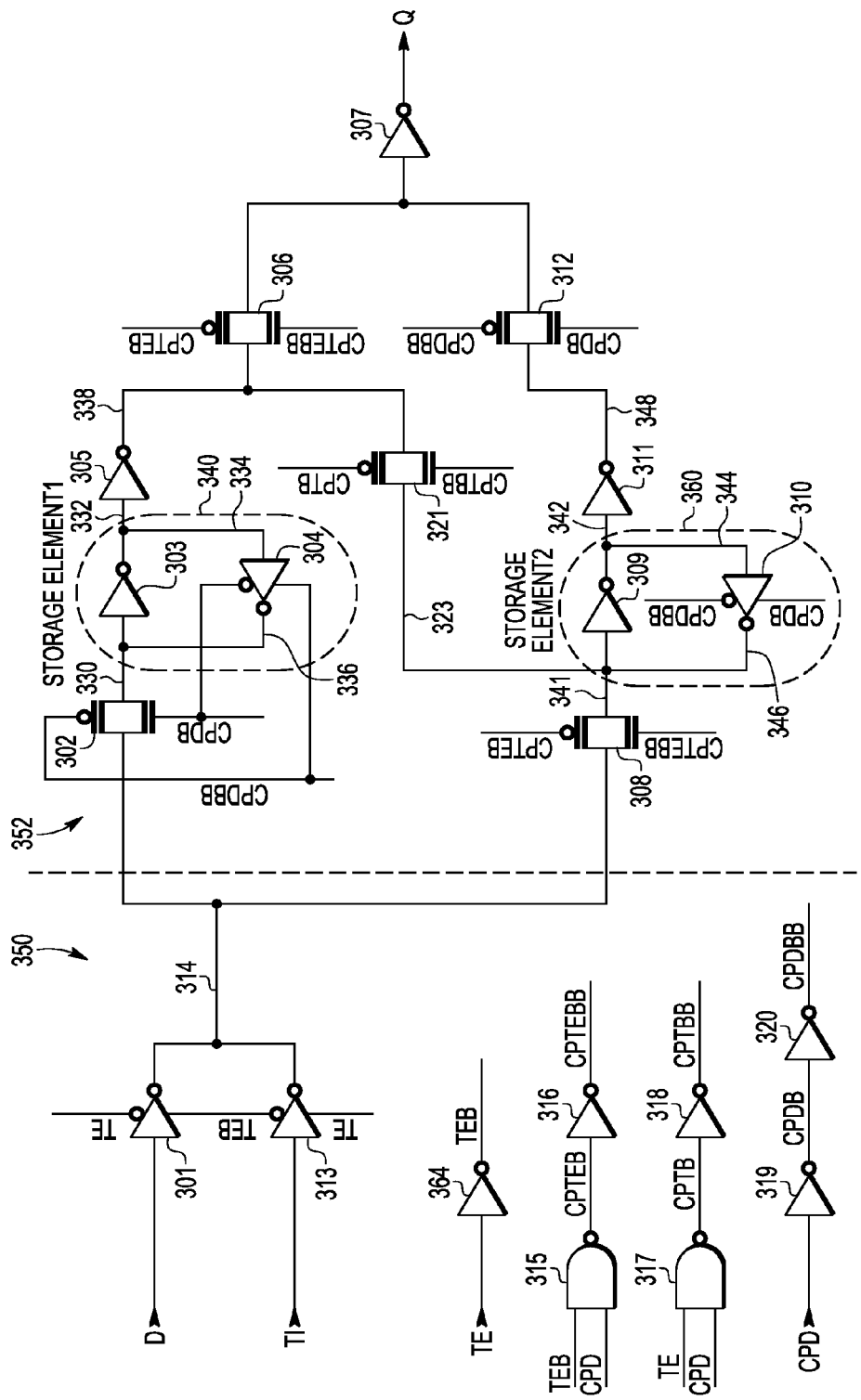
FIG. 3 is a circuit diagram of a reconfigurable dual-edge triggered flip-flop (DET) to a master-slave flip-flop (MSFF), in accordance with one embodiment of the invention.

Referring to FIG. 3 a circuit diagram of one embodiment of a reconfigurable DETFF to a MSFF circuit 300 is shown. The circuit is broadly broken into two major sections, an input select section 350 and a DETFF/MSFF section 352. In the input select section 350 two control signals Test Enable (TE) and Test Enable BAR (TEB=$\overline{TE}$) are used to control selection of either input signal D (Data) or TI (Test Input) to passed through to line 314. Specifically either transmission gate 301 or transmission gate 313 are selected by the two control signals TE and TEB to pass either D or TI to line 314. The transmission gates 301, 313, in one example, are tri-state inverters.

Next, the set of control signals TE and Clock (CPD) are used to control the rest of the circuit. More specifically, inverter gate 364 has TE as an input and produces TEB as the output. Inputs TEB and CPD to Boolean NAND gate 315 to produce CPTEB=$\overline{TEB \cdot CPD}$, This is further inverted by inverter gate 316 to produce CPTEBB=CPTEB BAR=$\overline{CPTEB}$. Another NAND gate 317 has inputs TE and CPD to produce CPTB=$\overline{TE \cdot CPD}$ and a inverter gate 318 to produce CPTBB=$\overline{CPTB}$. Two inverter gates 319 and 320 produce CPDB=$\overline{CPD}$ and CPDBB=$\overline{CPDB}$ respectively. A summary of all the control signals for the DETFF/MSFF section 352 is as follows:

Control Signals in the Input Select Section 350
 D=Data
 TI=Test Input
 TE=Test Enable
 TEB=Test Enable BAR=$\overline{TE}$
 CPD=CLOCK
 CPTEB=CPTE BAR=$\overline{TEB \cdot CPD}$
 CPTEBB=CPTEB BAR=$\overline{CPTEB}$
 CPTB=$\overline{TE \cdot CPD}$
 CPTBB=CPTB BAR=$\overline{CPTB}$
 CPDB=$\overline{CPD}$
 CPDBB=CPD BAR=$\overline{CPDB}$ Normal Modes—Dual-Edge Triggered Flip-Flop (DETFF) Section 352

The normal modes of operation will now be described follow by a description of the test modes of operation MSFF and DETFF in the DETFF/MSFF section 352.

MSFF (Normal Mode)—HIGH

Figure 4:
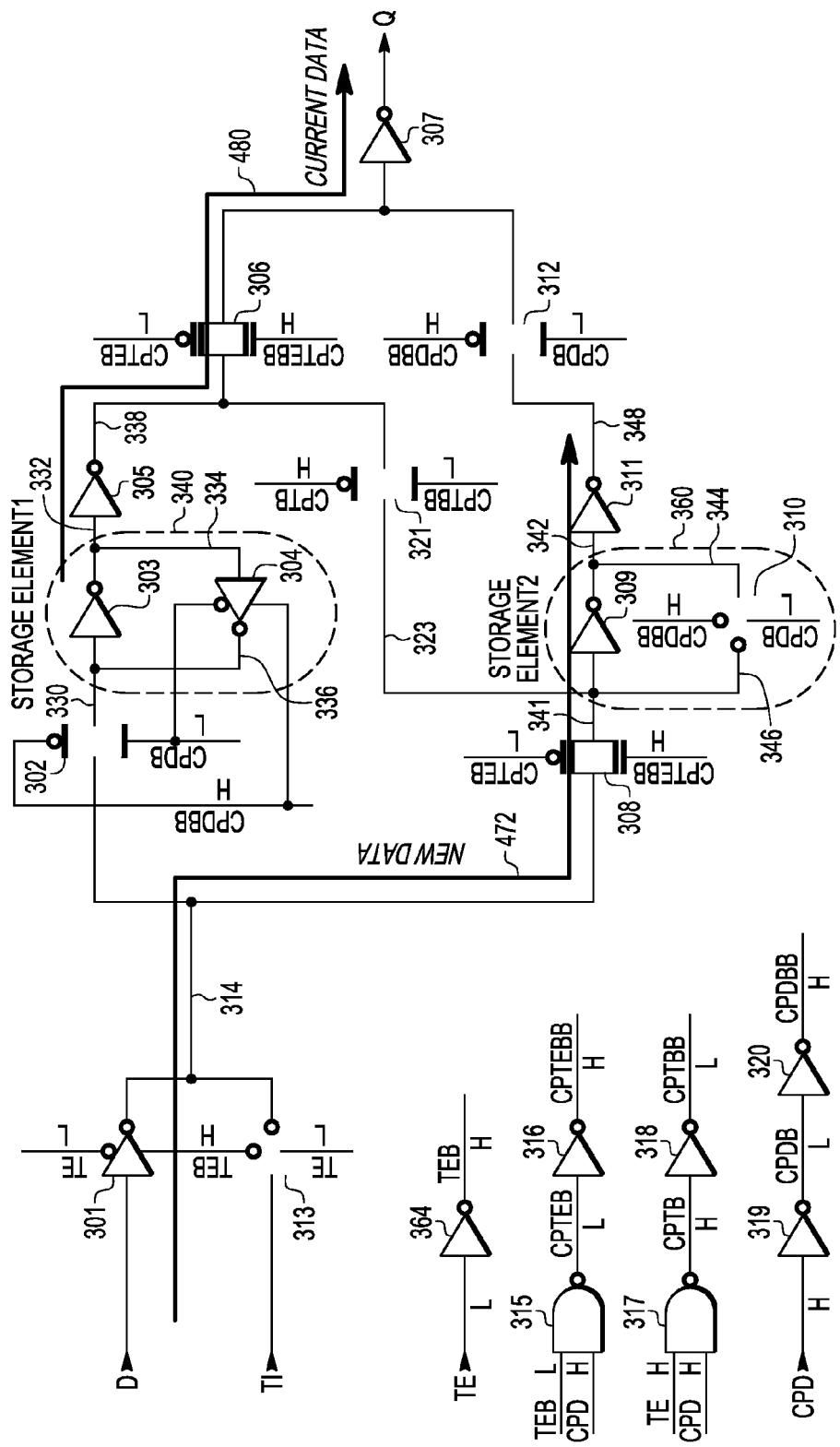
FIG. 4 is a circuit diagram of FIG. 3 in a normal mode clock HIGH operation.
Figure 5:
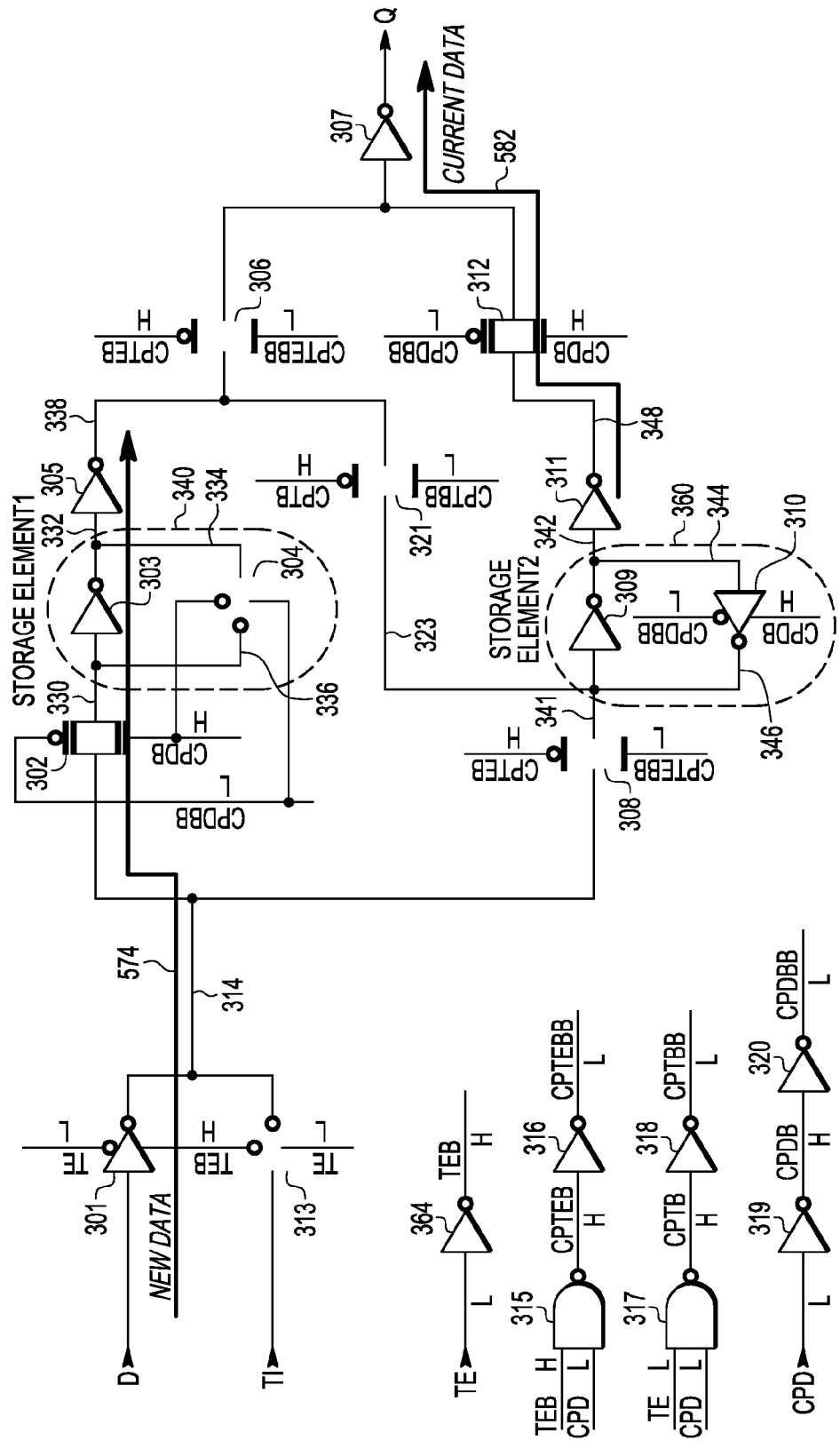
FIG. 5 is a circuit diagram of FIG. 3 in a normal mode clock LOW operation.

It is important to note that in the figures identical reference numerals refer to identical features through several views. Gates and inverters that are "partially illustrated" denote a logical OFF state. For example, the partially illustrated transmission gate 302 in FIG. 4 is OFF. In contrast, the transmission gate 302 in FIG. 5 is ON. Furthermore, an arrow in FIG. 4 labeled "NEW DATA" 314 denotes a data value D being stored in a storage element. The arrow labeled "CURRENT DATA" 480 in FIG. 4 denotes a data value being sent to the output Q. The term "coupled" as used herein, is defined as "connected" although not necessarily directly. The term "line" denotes electrically coupled as through a conductor or circuit trace.

Starting with the normal modes, FIG. 4 is a circuit diagram of FIG. 3 in a normal mode with the clock CPD at logic HIGH. Note that each control line throughout the figures is labeled as either "H" for logic HIGH or "L" for logic LOW. With the normal operation, the test enable input TE is LOW, data D from input terminal is passed through inverter gate 301 to line 314 through transmission gate 308 by line 341 to inverter 309 of the second storage element 360. The output of inverter 309 is coupled to output inverter 311 by line 342. This is shown by arrow 472. Feedback inverter 310 is connected to the output of inverter 309 by line 344 in the second storage element 360. The feedback inverter 310 is OFF. Also, an output from feedback inverter 310 is coupled to the input of inverter 309 by line 346. The output inverter 311 of the second storage element 360 is coupled to the output transmission gate 312 by line 348. The output Q is disconnected to the output inverter 311 by output transmission gate 312 being OFF. Also in the normal mode, the cross-storage transmission gate 321 coupled by lines 338 and 323 to the input of the second storage element 360 is OFF. The current data stored in the first storage element 340 is passed through output transmission gate 306 to output Q as shown by arrow 480 when the clock CPD transitions from logic HIGH to logic LOW.

MSFF (Normal Mode)—LOW

FIG. 5 is a circuit diagram of FIG. 3 in a normal mode with the clock CPD at logic LOW. With the normal operation, the test enable input TE is LOW, data D from input terminal is passed through transmission gate 301 to line 314 through transmission gate 302 by line 330 to inverter 303 of the first storage element 340. The output of inverter 303 is coupled to output inverter 305 by line 332. This is shown by arrow 574. Feedback inverter 304 is connected to the output of inverter 303 by line 334 in the first storage element 340. The feedback inverter 304 is OFF. Also, an output from feedback inverter 340 is coupled to the input of inverter 303 by line 336. The output inverter 305 of the first storage element 340 is coupled to the output transmission gate 306 by line 338. The output inverter 305 of the first storage element 340 is disconnected to output Q by output transmission gate 306 being OFF. The cross-storage transmission gate 321 used for test mode is OFF. The current data stored in the second storage element 360 is passed through output transmission gate 312 to output Q as shown by arrow 582 when the clock CPD transitions from logic LOW to logic HIGH.

MSFF (Normal Mode)—Waveform

Figure 6:
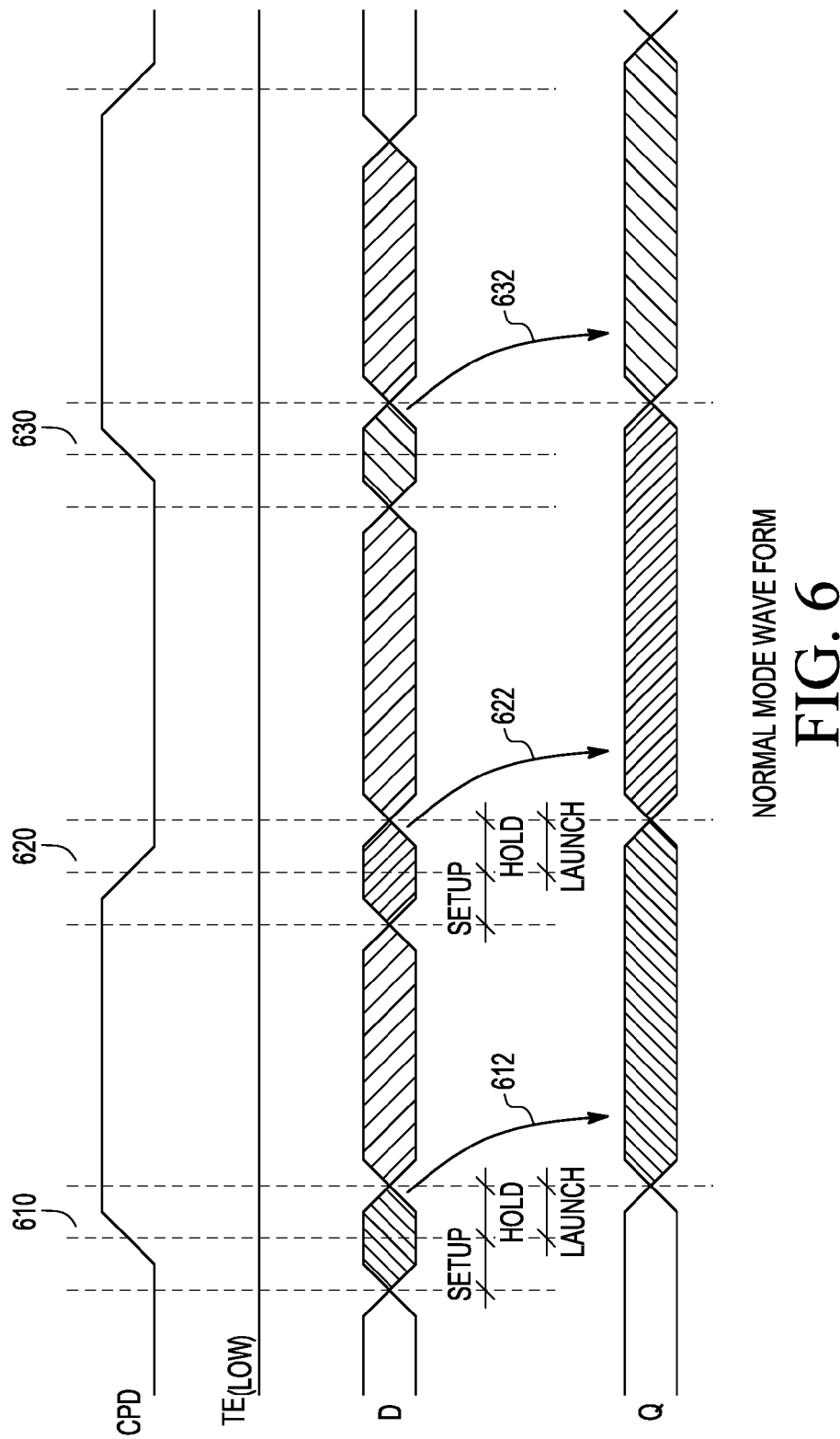
FIG. 6 is a waveform of FIG. 4 and FIG. 5 in the normal mode.

FIG. 6 illustrates a waveform of the clock signal CPD. In FIG. 6 the test enable input TE is LOW. Notice that the data on D is "launched" to the output Q 612, 622 and 632 on both the rising clock edge 610, 630 as well as the falling clock edge 620 as shown.

Test Modes—Master-Slave Flip-Flop (MSFF)

Generally, in the test mode, the first storage element 340 acts as a master latch and the second storage element 360 acts as slave latch. This forms a master-slave flip-flop (MSFF). The output Q changes at the rising edge of the clock CPD based on the input data D setup to the rising edge of the clock CPD. The specifics of this test mode are now described.

DETFF (Test Mode)—HIGH

Figure 7:
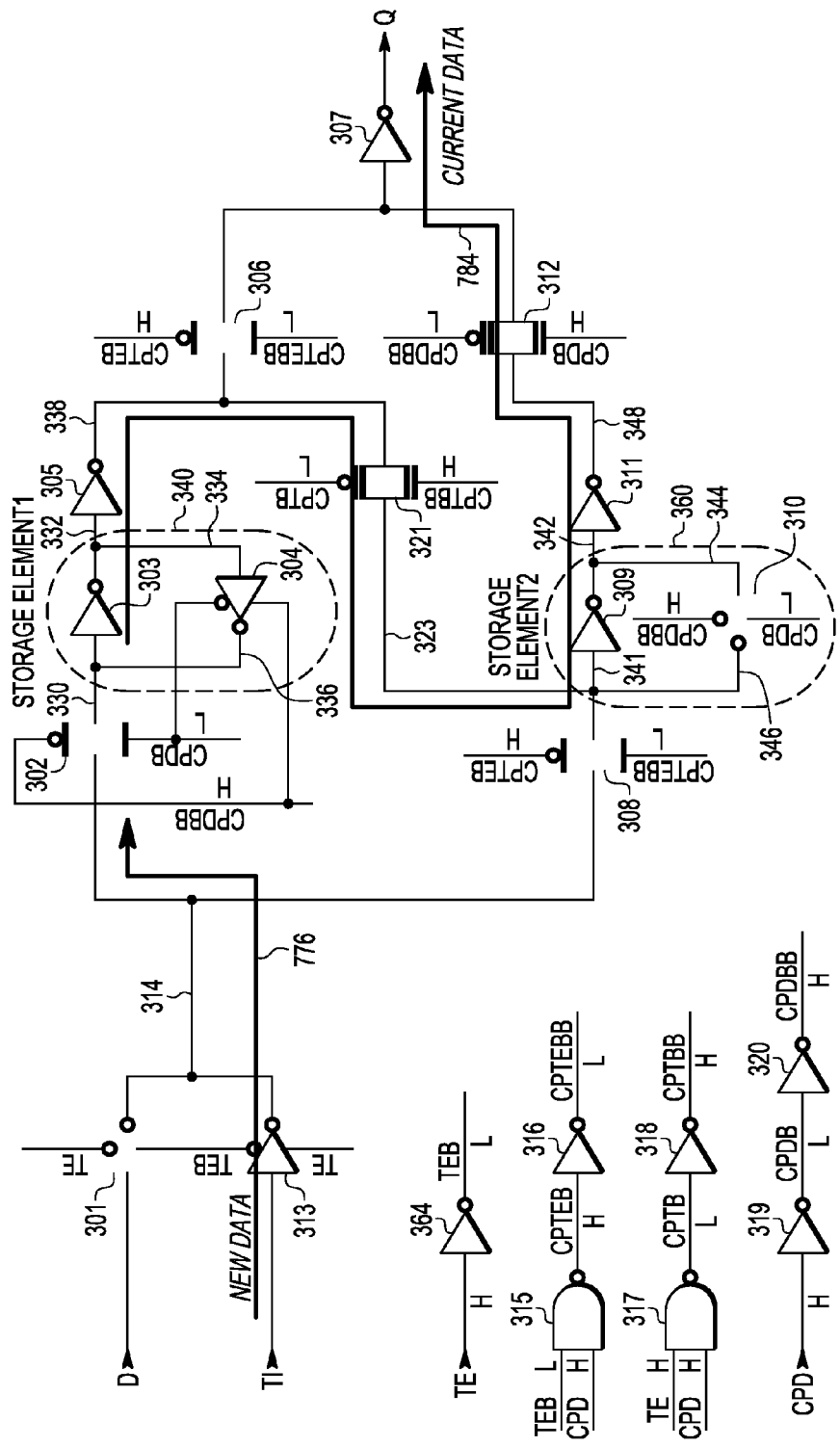
FIG. 7 is a circuit diagram of FIG. 3 in a test mode HIGH operation.

FIG. 7 is a circuit diagram of FIG. 3 in a test mode with the clock CPD at logic HIGH. With the test operation, the test enable input TE is HIGH, data TI from input terminal is passed through transmission gate 313 to line 314 this is shown by arrow 776. Feedback inverter 304 in the first storage element 340 is ON. The output of the first storage element 340 is disconnected to output Q by transmission gate 306 being OFF. In this test mode with the clock CPD at logic HIGH, the cross-storage transmission gate 321 is ON. The current data stored in the first storage element 340 is passed through cross-storage transmission gate 321 to the inverter 309 in the second storage element 360 is passed through output transmission gate 312 to output Q as shown by arrow 784 when the clock CPD transitions from logic LOW to logic HIGH.

DETFF (Test Mode)—LOW

Figure 8:
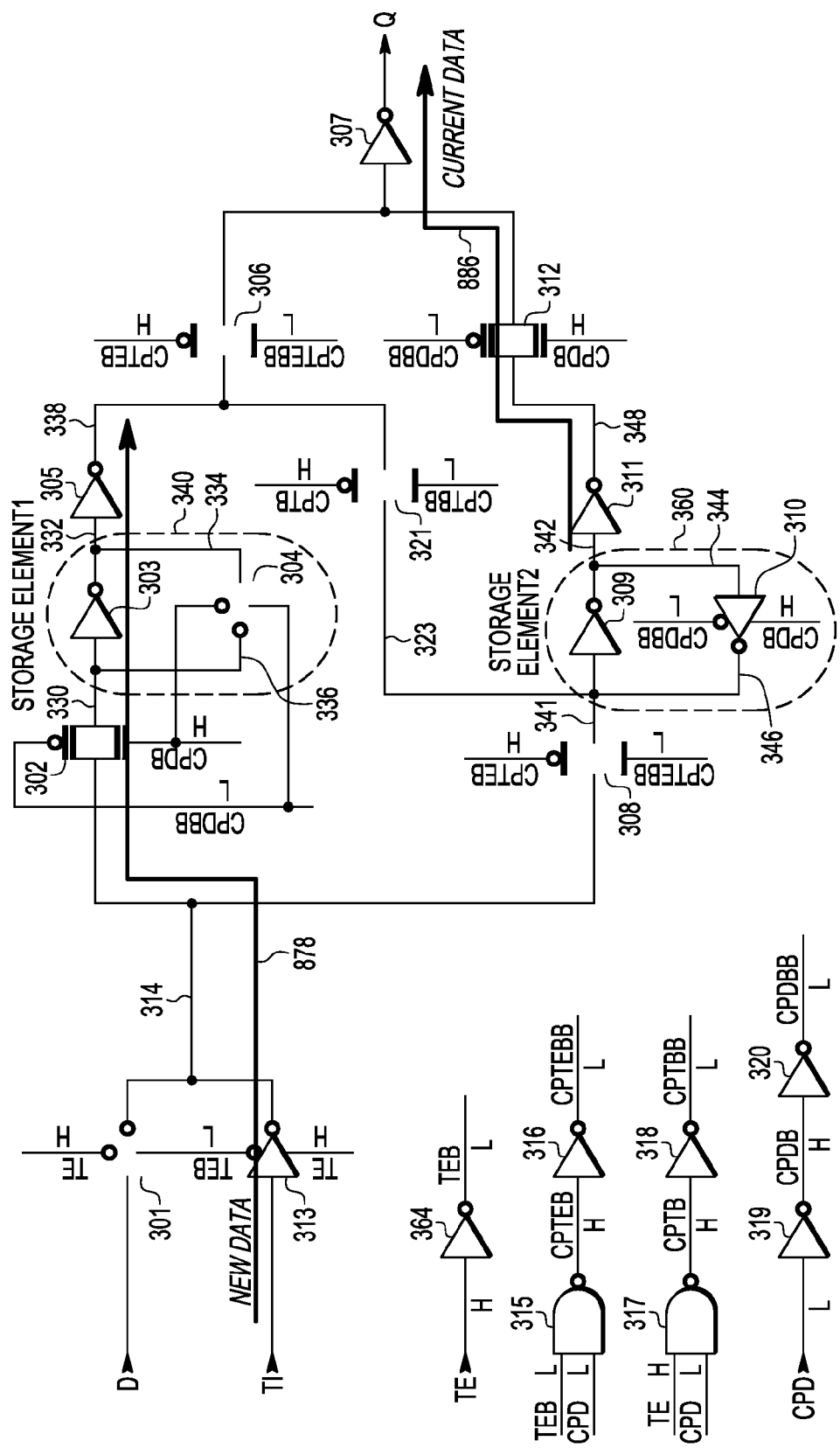
FIG. 8 is a circuit diagram of FIG. 3 in a test mode LOW operation.

FIG. 8 is a circuit diagram of FIG. 3 in a test mode with the clock CPD at logic LOW. With the test operation, the test enable input TE is HIGH, data D from input terminal is passed through transmission gate 313 to line 314 through transmission gate 302 to inverter 303 of the first storage element 340. This is shown by arrow 878. Feedback inverter 304 in the first storage element 340 is OFF. The output of the first storage element 340 is disconnected to output Q by transmission control gate 306 being OFF. In this test mode, the cross-storage transmission gate 321 is OFF. The current data stored in the second storage element 360 is passed through output transmission gate 312 to the inverter 307 to output Q as shown by arrow 886 when the clock CPD transitions from logic HIGH to logic LOW.

DETFF (Test Mode)—Waveform

Figure 9:
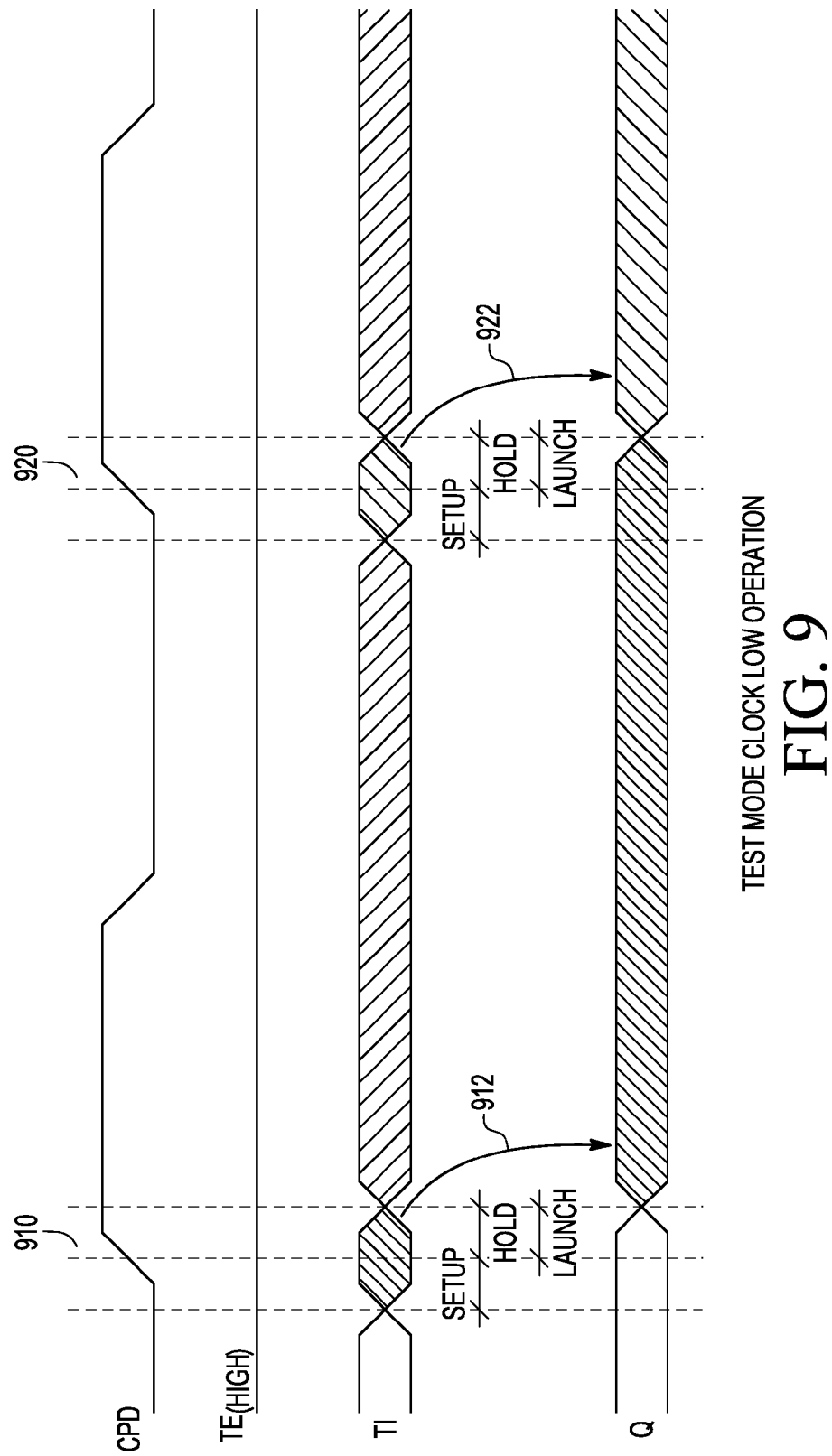
FIG. 9 is a waveform of FIG. 7 and FIG. 8 in the test mode.

FIG. 9 is a waveform of FIG. 7 and FIG. 8 in the test mode. The test enable input TE is HIGH and data D and output Q of the MSFF. Notice that the data on D is "launched" to output Q 912, 922 on the rising clock edge 910, 920, as shown.

EXAMPLE 2

Reconfigurable DETFF to a MSFF with Extra Latch

Figure 10:
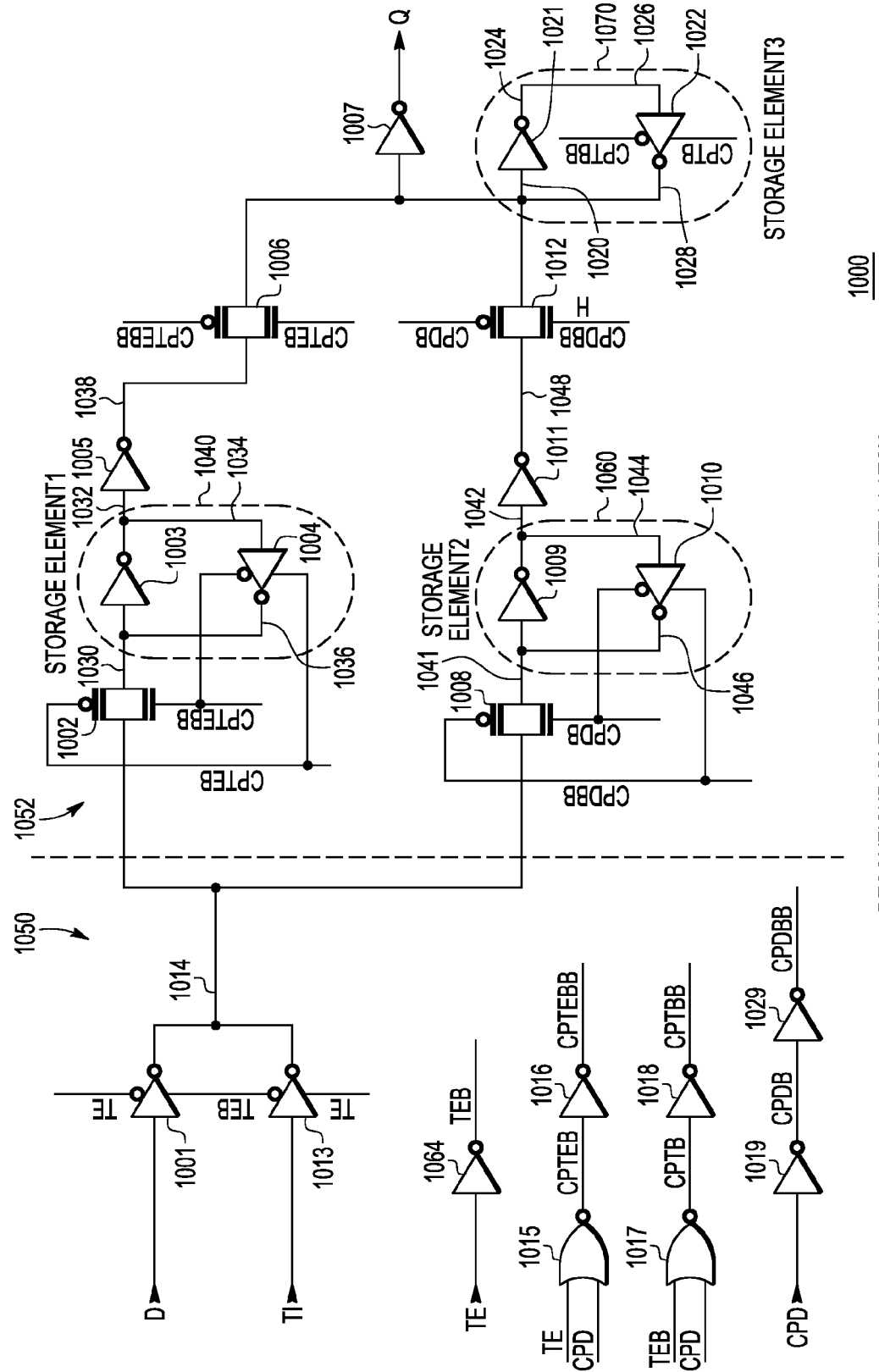
FIG. 10 is a circuit diagram of a reconfigurable dual-edge triggered flip-flop (DETFF) to a master-slave flip-flop (MSFF) with a hold latch, in accordance with one embodiment of the invention.

FIG. 10 is a circuit diagram 1000 of one embodiment of a reconfigurable DETFF to a MSFF with an extra latch. In normal mode operation, it is identical to DETFF-MSFF shown in FIGS. 3-5. In this normal mode, the hold latch or a third storage element 1070 is disabled completely.

The circuit is broadly broken into two major sections, an input select section 1050 and DET/MSFF section 1052. In the input select section 1050 two control signals Test Enable (TE) and Test Enable BAR (TEB=$\overline{TE}$) are used to control selection of either input signal D (Data) or TI (Test Input) to passed through to line 1014. Specifically either transmission gate 1001 or transmission gate 1013 are selected by the two control signals TE and TEB to pass either D or TI to line 1014. The transmission gates 1001, 1013, in one example, are tri-state inverters.

Next, the set of control signals TE and Clock (CPD) are used to control the rest of the circuit. More specifically, inverter gate 1064 has TE as an input and produces TEB as the output. Inputs TE and CPD to Boolean NOR gate 1015 produce CPTEB=$\overline{TE+CPD}$. This is further inverted by inverter gate 1016 to produce CPTEBB=CPTEB BAR=$\overline{CPTEB}$. Another NOR gate 1017 has inputs TEB and CPD to produce CPTB=$\overline{TEB+CPD}$ and a inverter gate 1018 to produce CPTBB=$\overline{CPTB}$. Two Inverter gate s 1019 and 1029 produce CPDB=$\overline{CPD}$ and CPDBB=$\overline{CPDB}$ respectively. A summary of all the control signals for the DET/MSFF section 1052 is as follows:

Control Signals in the Input Select Section 1050
  D=Data
  TI=Test Input
  TE=Test Enable
  TEB=Test Enable BAR=$\overline{TE}$
  CPD=CLOCK CPTEB=$\overline{TE+CPD}$
CPTEBB=CPTEB BAR=$\overline{CPTEB}$
CPTB=$\overline{TEB+CPD}$
CPDB=$\overline{CPD}$
CPDBB=CPD BAR=$\overline{CPDB}$ MSFF (Test Modes)

Generally, in the test mode, the first storage element 1040 acts is completely disabled because output transmission gate 1006 is OFF. The second storage element 1060 acts as master latch. Two inventors 1003 and 1004 are coupled by lines 1034 and 1036 as shown to form the first storage element 1040. Likewise, two inventers 1009 and 1010 are coupled by lines 1044 and 1046 as shown to form the second storage element 1040. This forms a master-slave flip-flop (MSFF) in section 1052. The third storage element 1070 acts as a slave latch during test mode. Two inventors 1021 and 1022 are coupled by lines 1026 and 1028 as shown to form the third storage element 1070. An input/output node 1020 of the third storage element 1070 is coupled to output Q through inverter 1007. The output Q changes at the rising edge of the clock CPD based on the input data TI setup to the rising edge of the clock CPD. In both the High Test Mode and Low Test Mode, the first storage element 1052 is not connected to the output inverter 1007 through lines 1032 and 1038 because output transmission gate 1006 is OFF. Inverter 1003 is connected to transmission gate 1002 by line 1030. The transmission gate 1002, inverter 1003 and inverter 1005 of the first storage element 1052 are all ON in both the High Test Mode and Low Test Mode. The feedback inverter 1004 is OFF in both the High Test Mode and Low Test Mode. Feedback inverter 1004 is connected to the output of inverter 1003 by line 1034 in the first storage element 1040. Also, an output from feedback inverter 1004 is coupled to the input of inverter 1003 by line 1036. The specifics of this test mode are now described.

MSFF (Test Mode)—HIGH

Figure 11:
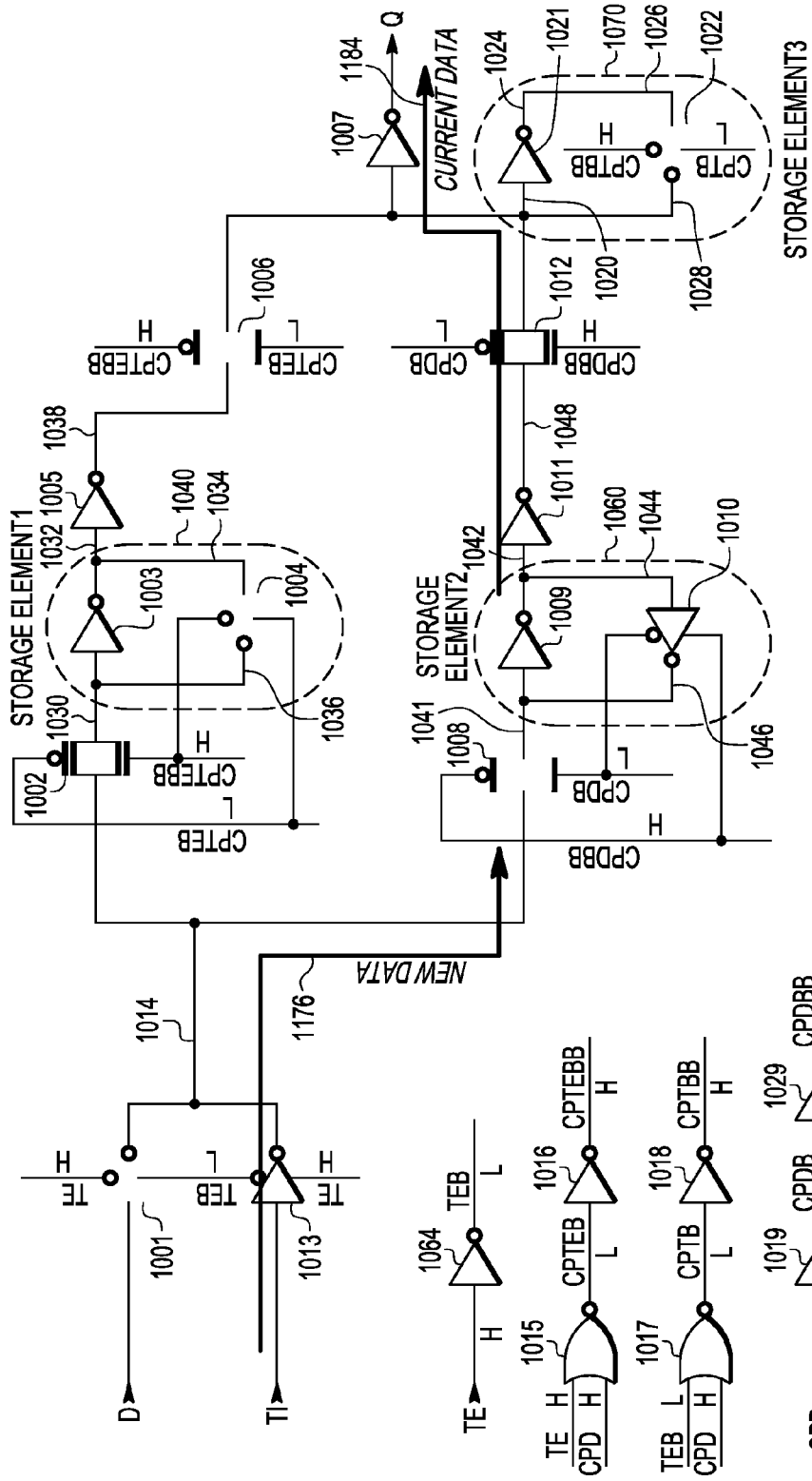
FIG. 11 is a circuit diagram of FIG. 10 in a test mode HIGH operation with the hold latch.

FIG. 11 is a circuit diagram of FIG. 10 in a test mode with the clock CPD at logic HIGH. With the test operation, the test enable input TE is HIGH, data TI from input terminal is passed through transmission gate 1013 to line 1014 this is shown by arrow 1176. Feedback inverter 1022 in the third storage element 1070 is OFF. Two inventors 1003 and 1004 are coupled by lines 1034 and 1036 as shown to form the first storage element 1040. Likewise, two inventors 1009 and 1010 are coupled by lines 1044 and 1046 as shown to form the second storage element 1040. The output of the 1370 second storage element 1060 through inverter 1011 is connected through lines 1048 and 1020 to output inverter 1007 Q by transmission gate 1012 being ON. This is indicated by arrow 1184. Also, output transmission gate 1006 is OFF so that the data stored in first storage element 1040 is not sent to output Q.

MSFF (Test Mode)—LOW

Figure 12:
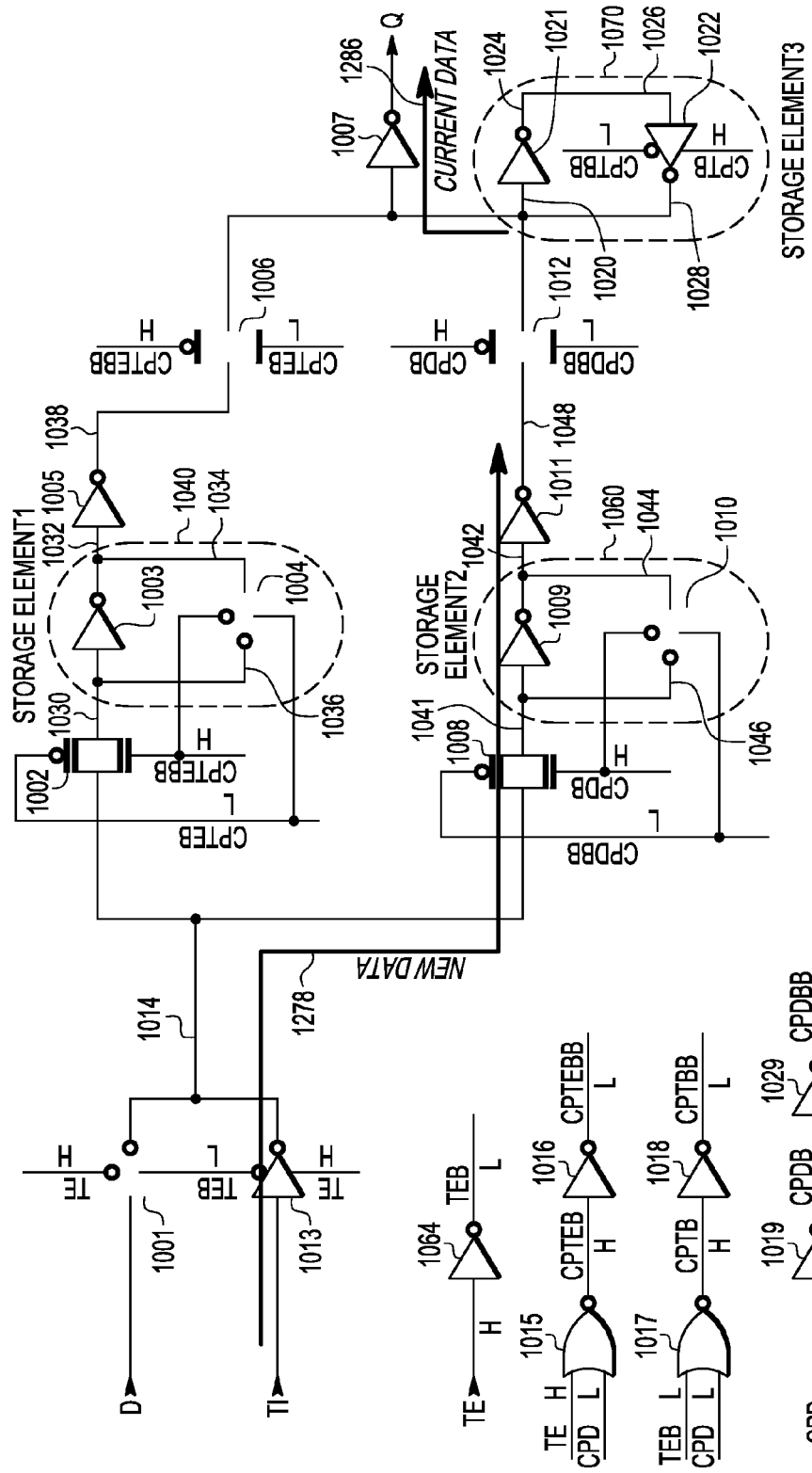
FIG. 12 is a circuit diagram of FIG. 10 in a test mode LOW operation with the hold latch.

FIG. 12 is a circuit diagram of FIG. 10 in a test mode with the clock CPD at logic LOW. With the test operation, the test enable input TE is HIGH, data D from input terminal is passed through transmission gate 1013 to line 1014 through transmission gate 1008 through line 1041 to inverter 1009 of the second storage element 1060. This is shown by arrow 1278. Inverter 1009 is connected to transmission gate 1008 by line 1041. Feedback inverter 1010 in the second storage element 1040 is OFF. Feedback inverter 1010 is connected to the output of inverter 1009 by line 1044 in the second storage element 1060. Also, an output from feedback inverter 1010 is coupled to the input of inverter 1009 by line 1046. The output inverter 1005 of the first storage element 1040 is coupled to the output transmission gate 1006 by line 1038. The output of the second storage element 1060 is disconnected to output Q by the output transmission gate 1012 being OFF. With the output transmission gate 1012 being OFF, the output of the third storage element 1070 is coupled to output Q. This is indicated by arrow 1286. Also output transmission gate 1006 is OFF so that the data through the first storage element is not sent to output Q.

EXAMPLE 3

Reconfigurable DETFF to a MSFF with Hold Latch

Figure 13:
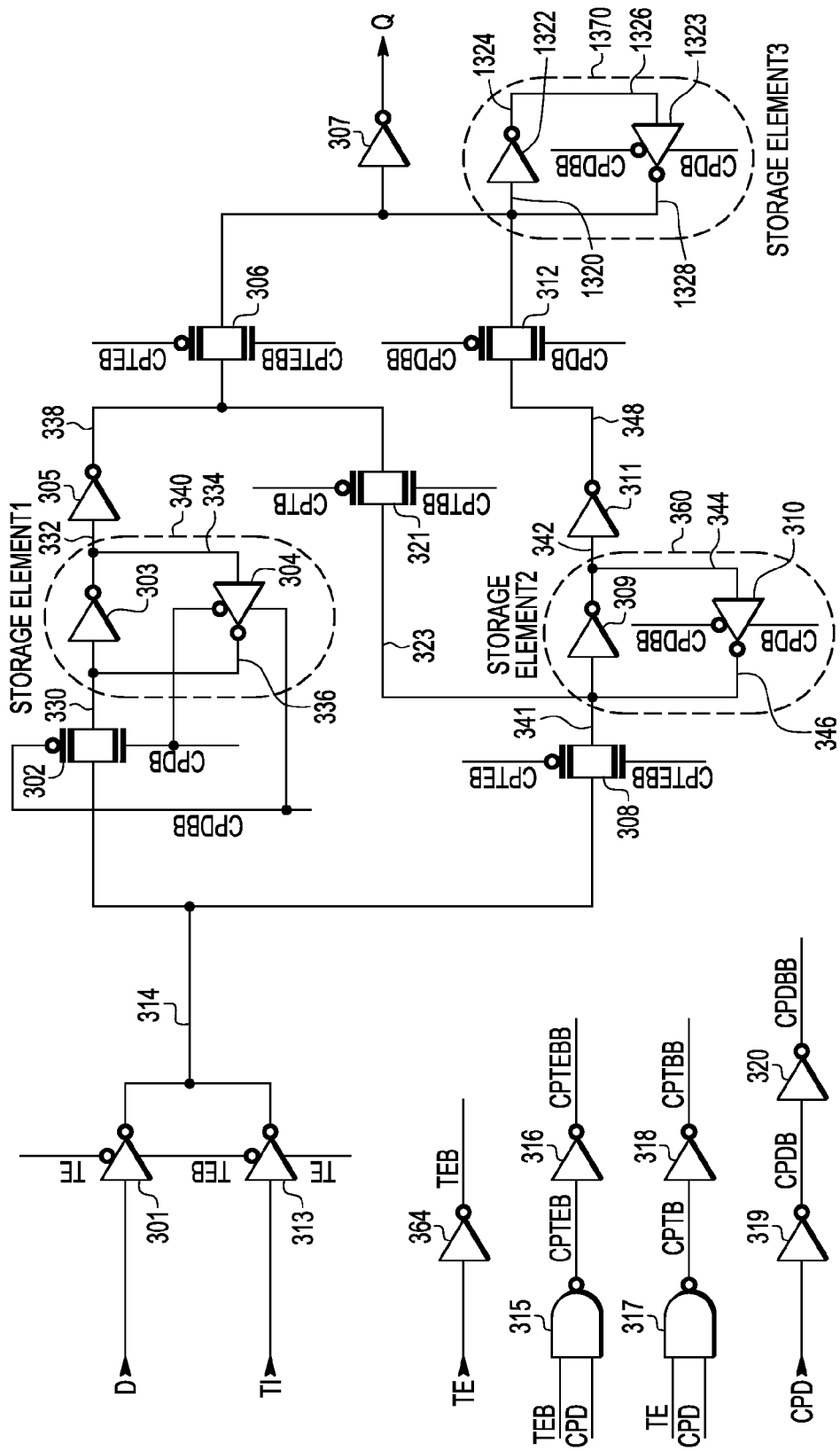
FIG. 13 is a circuit diagram of a reconfigurable dual-edge triggered flip-flop (DETFF) to a master-slave flip-flop (MSFF) of FIG. 3 with a hold latch, in accordance with one embodiment of the invention.

FIG. 13 is a circuit diagram of one embodiment of a flip-flop to a reconfigurable dual-edge triggered flip-flop (DE-TFF) to a master-slave flip-flop (MSFF) of FIG. 3 with a hold latch. In normal mode operation, it is identical to the DETFF-MSFF shown in FIGS. 3-5. In this normal mode, the hold latch, or a third storage element 1370, is disabled completely.
Test Modes—Master-Slave Flip-Flop (MSFF)

Generally, in the test mode, the first storage element 340 acts as master latch and the second storage element 360 acts as slave latch. The third storage element 1370 acts as a hold latch. Two inventors 1322 and 1323 are coupled by lines 1326 and 1328 as shown to form the third storage element 1370. This forms a master-slave flip-flop (MSFF) with Hold Latch. The output Q changes at the falling edge of the clock CPD based on the input data TI setup to the rising edge of the clock CPD.

DETFF (Test Mode)—HIGH

Figure 14:
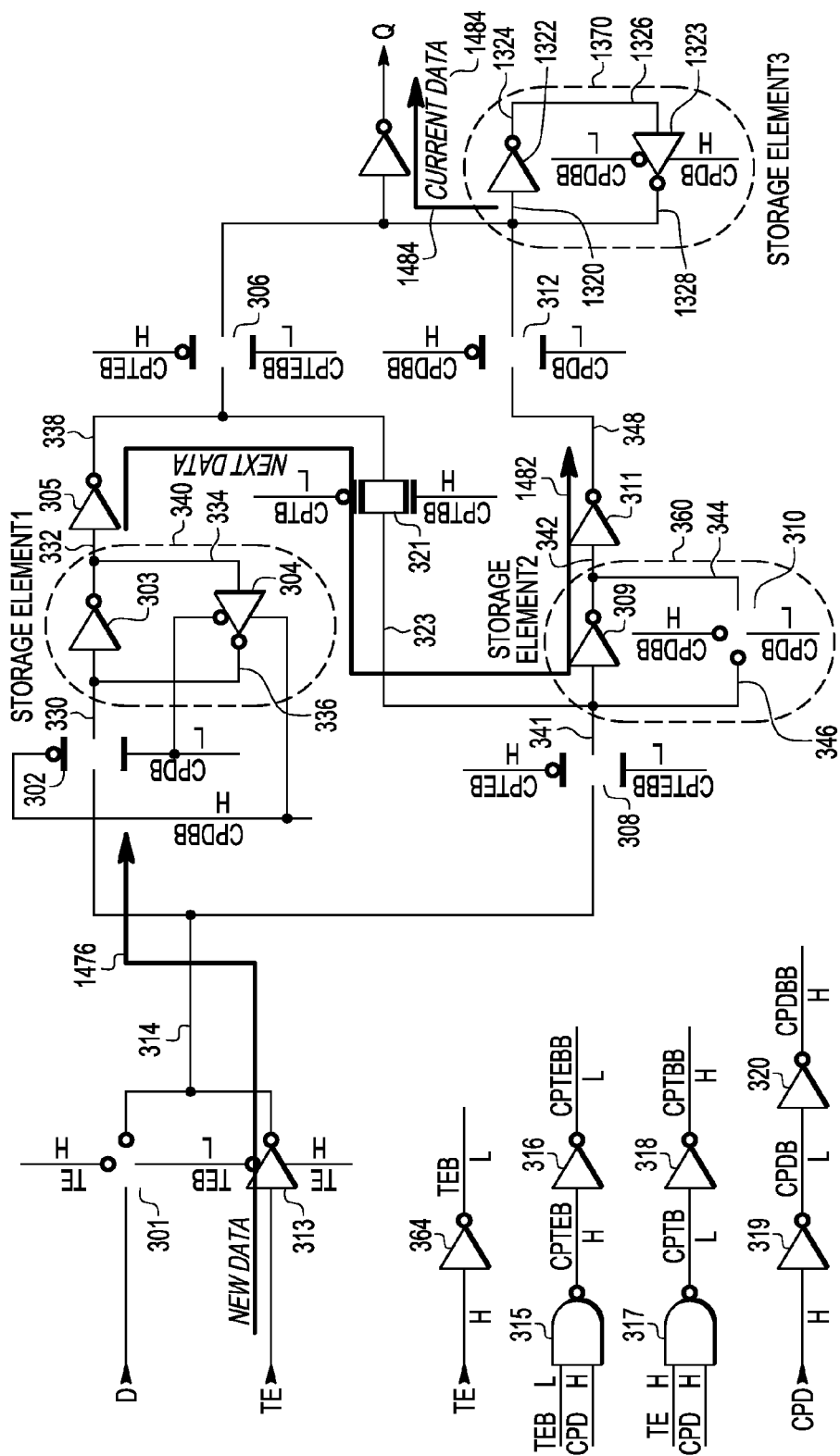
FIG. 14 is a circuit diagram of FIG. 13 in a test mode HIGH operation with the hold latch.

FIG. 14 is a circuit diagram of FIG. 13 in a test mode with the clock CPD at logic HIGH. With the test operation, the test enable input TE is HIGH, data TI from input terminal is passed through transmission gate 313 to line 314 this is shown by arrow 1476. Feedback inverter 304 in the first storage element 340 is ON. Transmission gate 308 is OFF so that TI on line 314 is not received by the second storage element 360. The output of the first storage element 340 is connected to the inventor 309 of the second storage element 360 through cross-storage transmission gate 321. This is shown by arrow 1482. Feedback inverter 310 in the second storage element 360 is OFF. Output transmission gate 312 is OFF disconnecting the output of the second storage element 360 from output Q. A value in the third storage element 1370 is passed to output Q indicated by arrow 1484.

DETFF (Test Mode)—LOW

Figure 15:
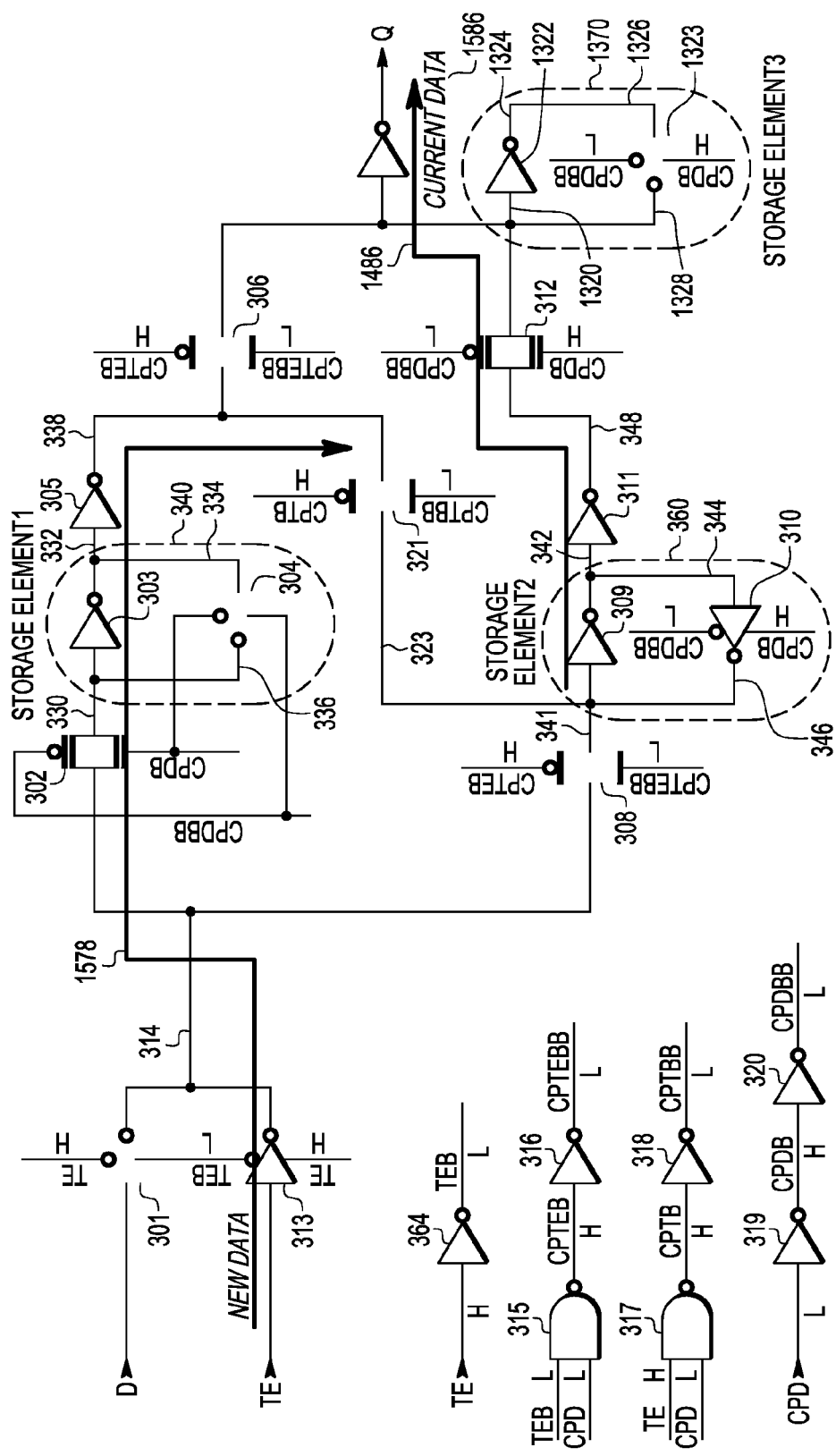
FIG. 15 is a circuit diagram of FIG. 13 in a test mode LOW operation with the hold latch.

FIG. 15 is a circuit diagram of FIG. 13 in a test mode with the clock CPD at logic LOW. With the test operation, the test enable input TE is HIGH, data TI from input terminal is passed through transmission gate 313 to line 314 through transmission gate 302 to inverter 303 of the first storage element 340. This is shown by arrow 1578. Feedback inverter 304 in the first storage element 340 is OFF. Cross-storage transmission gate 321 is OFF, disconnecting the output of the first storage element 340 to the inventor 309 of the second storage element 360. Output transmission gate 312 is ON forwarding the output of the second storage element 360 to output Q. Inverter 1322 is ON and feedback inverter 1323 of the third storage element 1370 is OFF. This indicated by arrow 1586.

DETFF (Test Mode)—Waveform

Figure 16:
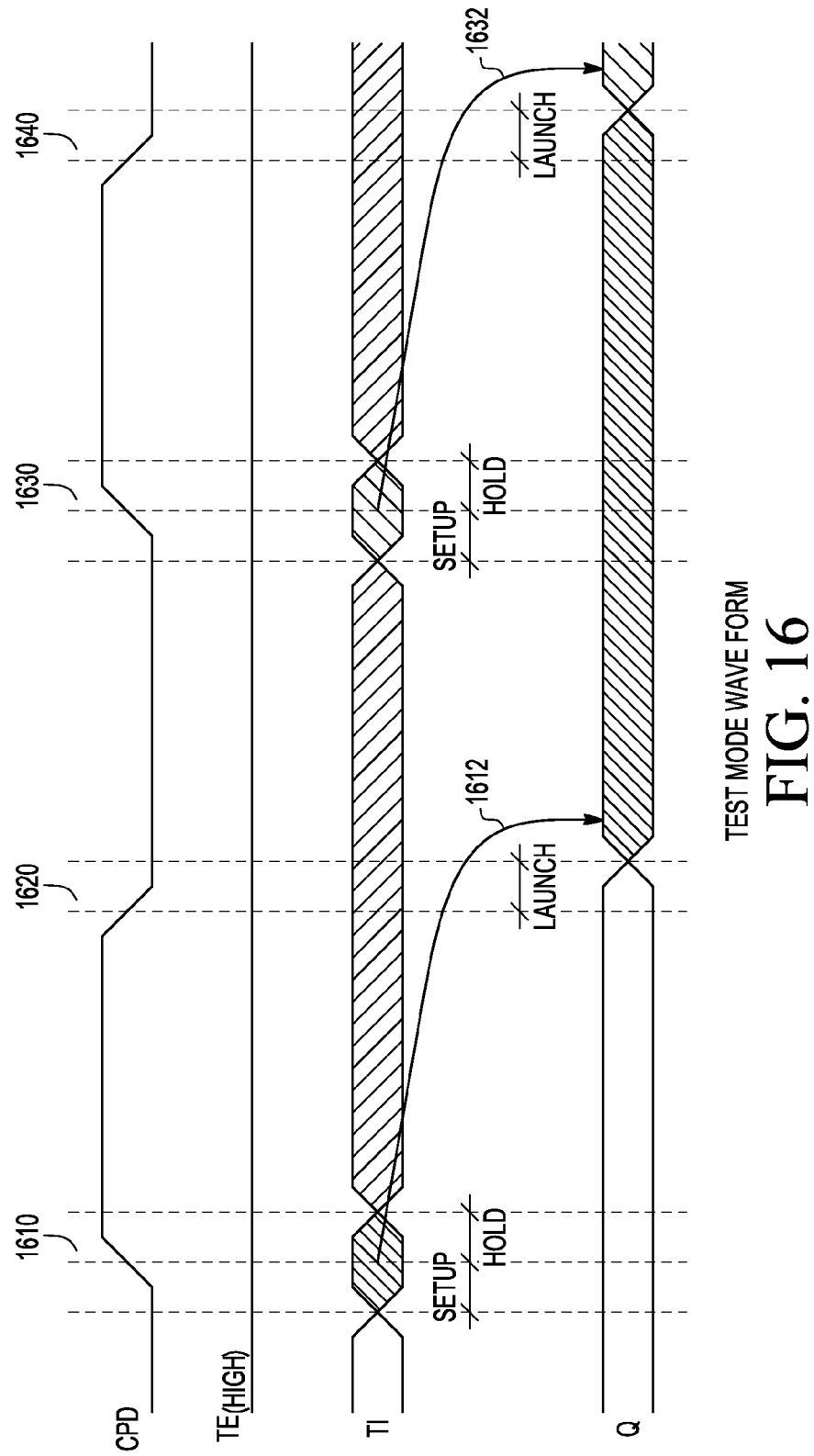
FIG. 16 is a waveform of FIG. 14 and FIG. 15 in the test mode.

FIG. 16 is a waveform of FIG. 14 and FIG. 15 in the test mode. The test enable input TE is HIGH and data D and output Q of the MSFF. Notice that the data on D is "launched" only the falling clock edge 1620, 1640 as shown.

Although the invention has been described with respect to specific conductivity types or polarity of potentials, skilled artisans appreciated that conductivity types and polarities of potentials may be reversed.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:

1. A reconfigurable flip-flop circuit, comprising:
an input;
a common output;
a first storage element including an input thereto electrically coupled to the input through at least a first storage element input switch, and an output therefrom electrically coupled to the common output through at least at least a first storage element output switch;
a second storage element including an input thereto electrically coupled to the input through at least a second storage element input switch, and an output therefrom electrically coupled to the common output through at least a second storage element output switch;
control circuitry, the control circuitry configured such that during a first mode of operating, the control circuitry configures each of the first storage element and the second storage element to operate as latches in a dual-edge triggered flip-flop, and during a second mode of operating, the control circuitry configures the second storage element to operate as a latch in a master slave flip-flop; and
a cross-storage element switch with a first terminal and a second terminal, the first terminal electrically coupled to the output of the first storage element and the second terminal electrically coupled to the input of the second storage element.

2. The reconfigurable flip-flop circuit of claim 1, wherein the first storage element further includes:
at least a first inverter including an input electrically coupled to the input and an output, and
at least a second inverter including an input electrically coupled to the output of the first inverter and an output electrically coupled to the input of the first inverter; and
wherein the second storage element further includes:
at least a third inverter including an input electrically coupled to the input and an output, and
at least a fourth inverter including an input electrically coupled to the output of the third inverter and an output electrically coupled to the input of the third inverter.

3. The reconfigurable flip-flop circuit of claim 2, wherein the input further comprises
a first inverter disposed between a data input and the input, and a second inverter disposed between a test input and the input, wherein the control circuitry selectively controls whether information from the data input or the test input is transmitted to the input.

4. The reconfigurable flip-flop circuit of claim 1, wherein the input further comprises
 a first inverter disposed between a data input and the input, and
 a second inverter disposed between a test input and the input, wherein the control circuitry selectively controls whether information from the data input or the test input is transmitted to the input.

5. The reconfigurable flip-flop circuit of claim 4,
 wherein the first storage element further includes:
  at least a first inverter including an input electrically coupled to the input and an output, and
  at least a second inverter including an input electrically coupled to the output of the first inverter and an output electrically coupled to the input of the first inverter; and
 wherein the second storage element further includes:
  at least a third inverter including an input electrically coupled to the input and an output, and
  at least a fourth inverter including an input electrically coupled to the output of the third inverter and an output electrically coupled to the input of the third inverter.

6. The reconfigurable flip-flop circuit of claim 1,
 wherein during the first mode of operating, the control circuitry couples in parallel the first storage element and the second storage element to operate as the dual-edge triggered flip-flop, and during the second mode of operating, the control circuitry couples in series the first storage element and the second storage element through at least a cross-storage element switch to operate as the master slave flip-flop.

7. A reconfigurable flip-flop circuit, comprising:
 an input;
 a common output;
 a first storage element including an input thereto electrically coupled to the input through at least a first storage element input switch, and an output therefrom electrically coupled to the common output through at least at least a first storage element output switch;
 a second storage element including an input thereto electrically coupled to the input through at least a second storage element input switch, and an output therefrom electrically coupled to the common output through at least a second storage element output switch; and
 control circuitry, the control circuitry configured such that during a first mode of operating, the control circuitry configures each of the first storage element and the second storage element to operate as latches in a dual-edge triggered flip-flop, and during a second mode of operating, the control circuitry configures the second storage element to operate as a latch in a master slave flip-flop,
 wherein during the first mode of operating, the control circuitry couples in parallel the first storage element and the second storage element to operate as the dual-edge triggered flip-flop, and during the second mode of operating, the control circuitry couples in series the first storage element and the second storage element through at least a cross-storage element switch to operate as the master slave flip-flop.

8. The reconfigurable flip-flop circuit of claim 7, further comprising:
 a cross-storage element switch with a first terminal and a second terminal, the first terminal electrically coupled to the output of the first storage element and the second terminal electrically coupled to the input of the second storage element.

9. The reconfigurable flip-flop circuit of claim 7,
 wherein the first storage element further includes:
  at least a first inverter including an input electrically coupled to the input and an output, and
  at least a second inverter including an input electrically coupled to the output of the first inverter and an output electrically coupled to the input of the first inverter; and
 wherein the second storage element further includes:
  at least a third inverter including an input electrically coupled to the input and an output, and
  at least a fourth inverter including an input electrically coupled to the output of the third inverter and an output electrically coupled to the input of the third inverter.

10. The reconfigurable flip-flop circuit of claim 9, wherein the input further comprises
 a first inverter disposed between a data input and the input, and
 a second inverter disposed between a test input and the input, wherein the control circuitry selectively controls whether information from the data input or the test input is transmitted to the input.

11. The reconfigurable flip-flop circuit of claim 7, wherein the input further comprises
 a first inverter disposed between a data input and the input, and
 a second inverter disposed between a test input and the input, wherein the control circuitry selectively controls whether information from the data input or the test input is transmitted to the input.

12. The reconfigurable flip-flop circuit of claim 11,
 wherein the first storage element further includes:
  at least a first inverter including an input electrically coupled to the input and an output, and
  at least a second inverter including an input electrically coupled to the output of the first inverter and an output electrically coupled to the input of the first inverter; and
 wherein the second storage element further includes:
  at least a third inverter including an input electrically coupled to the input and an output, and
  at least a fourth inverter including an input electrically coupled to the output of the third inverter and an output electrically coupled to the input of the third inverter.

13. A reconfigurable flip-flop circuit, comprising:
 an input;
 a common output;
 a cross-storage element switch including a first terminal and a second terminal;
 a first storage element including an input electrically coupled to the input through at least a first storage element input switch, and an output electrically coupled to the common output through at least a first storage element output switch and the first terminal of the cross-storage element switch;
 a second storage element including an input electrically coupled to the input through at least a second storage element input switch and the input electrically coupled to the second terminal of the cross-storage element switch, and an output electrically coupled to the common output through at least a second storage element output switch; and control circuitry, the control circuitry configured such that during a first mode of operating, the control circuitry couples in parallel the first storage element and the second storage element to operate as a dual edge triggered flip-flop, and during a second mode of operating, the control circuitry couples in series the first storage element and the second storage element through at least the second storage element to operate as a master slave flip-flop.

14. The reconfigurable flip-flop circuit of claim 13, wherein during the first mode of operating, the control circuitry couples in parallel the first storage element and the second storage element to operate as the dual-edge triggered flip-flop, and during the second mode of operating, the control circuitry couples in series the first storage element and the second storage element through at least the cross-storage element switch to operate as the master slave flip-flop.

15. The reconfigurable flip-flop circuit of claim 14,
wherein the first storage element further includes:
at least a first inverter including an input electrically coupled to the input and an output, and
at least a second inverter including an input electrically coupled to the output of the first inverter and an output electrically coupled to the input of the first inverter; and
wherein the second storage element further includes:
at least a third inverter including an input electrically coupled to the input and an output, and
at least a fourth inverter including an input electrically coupled to the output of the third inverter and an output electrically coupled to the input of the third inverter.

16. The reconfigurable flip-flop circuit of claim 14, wherein the input further comprises
a first inverter disposed between a data input and the input, and
a second inverter disposed between a test input and the input, wherein the control circuitry selectively controls whether information from the data input or the test input is transmitted to the input.

17. The reconfigurable flip-flop circuit of claim 13,
wherein the first storage element further includes:
at least a first inverter including an input electrically coupled to the input and an output, and
at least a second inverter including an input electrically coupled to the output of the first inverter and an output electrically coupled to the input of the first inverter; and
wherein the second storage element further includes:
at least a third inverter including an input electrically coupled to the input and an output, and
at least a fourth inverter including an input electrically coupled to the output of the third inverter and an output electrically coupled to the input of the third inverter.

18. The reconfigurable flip-flop circuit of claim 17, wherein during the first mode of operating, the control circuitry couples in parallel the first storage element and the second storage element to operate as the dual-edge triggered flip-flop, and during the second mode of operating, the control circuitry couples in series the first storage element and the second storage element through at least the cross-storage element switch to operate as the master slave flip-flop.

19. The reconfigurable flip-flop circuit of claim 17, wherein the input further comprises
a first inverter disposed between a data input and the input, and
a second inverter disposed between a test input and the input, wherein the control circuitry selectively controls whether information from the data input or the test input is transmitted to the input.

20. The reconfigurable flip-flop circuit of claim 13, wherein the input further comprises
a first inverter disposed between a data input and the input, and
a second inverter disposed between a test input and the input, wherein the control circuitry selectively controls whether information from the data input or the test input is transmitted to the input.

21. The reconfigurable flip-flop circuit of claim 13, further comprising:
a third storage element including
an input/output node electrically coupled to the second storage element output switch, and
the input/output node electrically coupled to the common output, thereby operating as a hold latch during the first mode of operating.

22. The reconfigurable flip-flop circuit of claim 21,
wherein the first storage element further includes:
at least a first inverter including an input electrically coupled to the input and an output, and
at least a second inverter including an input electrically coupled to the output of the first inverter and an output electrically coupled to the input of the first inverter;
wherein the second storage element further includes:
at least a third inverter including an input electrically coupled to the input and an output, and
at least a fourth inverter including an input electrically coupled to the output of the third inverter and an output electrically coupled to the input of the third inverter; and
wherein the third storage element further includes:
at least a fifth inverter including an input electrically coupled to the common output and an output, and
at least a sixth inverter, including an input electrically coupled to the output of the fifth inverter and an output electrically coupled to the input of the fifth inverter.

23. The reconfigurable flip-flop circuit of claim 13, wherein the input further comprises
a first inverter disposed between a data input and the input, and
a second inverter disposed between a test input and the input, wherein the control circuitry selectively controls whether information from the data input or the test input is transmitted to the input.

* * * * *

UNITED STATES PATENT AND TRADEMARK OFFICE
CERTIFICATE OF CORRECTION

PATENT NO. : 8,493,121 B1
APPLICATION NO. : 13/605385
DATED : July 23, 2013
INVENTOR(S) : Ravindraraj Ramaraju It is certified that error appears in the above-identified patent and that said Letters Patent is hereby corrected as shown below:

In the Claims:

Column 8, in claim 1, line 29:

delete the first appearance of "at least".

Col. 9, in claim 7, line 44:

delete the first appearance of "at least".

Signed and Sealed this
Third Day of September, 2013

Teresa Stanek Rea
*Acting Director of the United States Patent and Trademark Office*